(12) United States Patent
Wang et al.

(10) Patent No.: US 7,560,303 B2
(45) Date of Patent: Jul. 14, 2009

(54) METHOD AND APPARATUS FOR LINEAR DIE TRANSFER

(75) Inventors: Haochuan Wang, South Pasadena, CA (US); Ali Mehrabi, Glendale, CA (US); Kouroche Kian, Altadena, CA (US); Xiaoming He, Arcadia, CA (US); Stephen Li, Huntington Beach, CA (US)

(73) Assignee: Avery Dennison Corporation, Pasadena, CA (US)

( * ) Notice: Subject to any disclaimer, the term of this patent is extended or adjusted under 35 U.S.C. 154(b) by 408 days.

(21) Appl. No.: 11/557,472

(22) Filed: Nov. 7, 2006

(65) Prior Publication Data
US 2008/0124842 A1 May 29, 2008

(51) Int. Cl.
*H01L 21/00* (2006.01)
(52) U.S. Cl. .......................... 438/107; 438/26; 438/48; 438/118; 257/E21.499; 257/E21.519
(58) Field of Classification Search .................... 438/55, 438/66; 257/E21.5
See application file for complete search history.

(56) References Cited

U.S. PATENT DOCUMENTS

| | | | |
|---|---|---|---|
| 3,497,948 | A | 3/1970 | Wiesler et al. |
| 3,568,307 | A | 3/1971 | Zanger et al. |
| 3,859,723 | A | 1/1975 | Hamer et al. |
| 4,346,514 | A | 8/1982 | Makizawa et al. |
| 4,590,667 | A | 5/1986 | Simon |
| 4,627,151 | A | 12/1986 | Mulholland et al. |
| 4,941,255 | A | 7/1990 | Bull |
| 5,628,855 | A | 5/1997 | Hartmann et al. |
| 6,204,092 | B1 | 3/2001 | Freund et al. |
| 6,527,964 | B1 | 3/2003 | Smith et al. |
| 6,566,744 | B2 | 5/2003 | Gengel |
| 6,848,162 | B2 | 2/2005 | Arneson et al. |
| 7,023,347 | B2 | 4/2006 | Arneson et al. |
| 7,244,326 | B2 * | 7/2007 | Craig et al. .................. 156/234 |
| 2003/0211652 | A1 | 11/2003 | Summers |
| 2004/0020036 | A1 | 2/2004 | Arneson et al. |
| 2004/0020037 | A1 | 2/2004 | Arneson et al. |

(Continued)

FOREIGN PATENT DOCUMENTS

EP       0075491       1/1987

(Continued)

*Primary Examiner*—Alexander G Ghyka
*Assistant Examiner*—Cheung Lee
(74) *Attorney, Agent, or Firm*—Patent Group Law Department Avery Dennison Corporation

(57) ABSTRACT

A method for assembling a semiconductor device including the steps of providing a penetrable substrate having an adhesive surface and a plurality of dies disposed on the adhesive surface; providing a strap lead substrate having a plurality of strap leads disposed thereon; dispensing a first plurality of strap leads from the plurality of strap leads; providing a plurality of pins; bringing the penetrable substrate into close proximity with the strap lead substrate so as to bringing the first plurality of strap leads into contact with the plurality of dies; pressing the first plurality of strap leads against the plurality of dies using the plurality of pins; and, moving the penetrable substrate away from the strap lead substrate while using the plurality of pins to maintain contact between the first plurality of strap leads and the plurality of dies. An apparatus for assembling a semiconductor device is also disclosed.

21 Claims, 6 Drawing Sheets

U.S. PATENT DOCUMENTS

| | | |
|---|---|---|
| 2004/0020038 A1 | 2/2004 | Arneson et al. |
| 2004/0020039 A1 | 2/2004 | Arneson et al. |
| 2004/0020040 A1 | 2/2004 | Arneson et al. |
| 2004/0250417 A1 | 12/2004 | Arneson et al. |
| 2004/0250949 A1 | 12/2004 | Arneson et al. |
| 2005/0005434 A1 | 1/2005 | Arneson et al. |
| 2005/0009232 A1 | 1/2005 | Arneson et al. |
| 2005/0015970 A1 | 1/2005 | Arneson et al. |

FOREIGN PATENT DOCUMENTS

| | | |
|---|---|---|
| EP | 0949662 | 10/1999 |
| EP | 0982762 | 4/2005 |
| JP | 3-30442 | 2/1991 |

\* cited by examiner

METHOD AND APPARATUS FOR LINEAR DIE TRANSFER

BACKGROUND

1. Field

The present invention relates generally to manufacturing of semiconductor devices, and more particularly, to a method and apparatus for die transfer.

2. Background

Automatic identification of products has become commonplace. For example, the ubiquitous barcode label, placed on food, clothing, and other objects, is currently the most widespread automatic identification technology that is used to provide merchants, retailers and shippers with information associated with each object or item of merchandise.

Another technology used for automatic identification products is Radio Frequency Identification (RFID). RFID uses labels or "tags" that include electronic components that respond to radio frequency commands and signals to provide identification of each tag wirelessly. Generally, RFID tags and labels comprise an integrated circuit (IC, or chip) attached to an antenna that responds to a reader using radio waves to store and access the ID information in the chip. Specifically, RFID tags and labels have a combination of antennas and analog and/or digital electronics, which often includes communications electronics, data memory, and control logic.

One of the obstacles to more widespread adoption of RFID technology is that the cost of RFID devices such as tags or labels is still relatively high as lower cost manufacturing of RFID devices has not been achievable using current production methods. Additionally, as the demand for RFID devices has increased, the pressure has increased for manufacturers to reduce the cost of the devices, as well as to reduce the size of the electronics as much as possible so as to: (1) increase the yield of the number of dies (i.e., chips) that may be produced from a semiconductor wafer, (2) reduce the potential for damage, as the final device size is smaller, and (3) increase the amount of flexibility in deployment, as the reduced amount of space needed to provide the same functionality may be used to provide more capability.

However, as the chips become smaller, the process of interconnecting them with other device components, such as antennas, becomes more difficult. Thus, to interconnect the relatively small contact pads on the chips to the antennas in RFID inlays, intermediate structures variously referred to as "strap leads," "interposers," and "carriers" are sometimes used to facilitate inlay manufacture. Interposers include conductive leads or pads that are electrically coupled to the contact pads of the chips for coupling the chips to the antennas. These leads provide a larger effective electrical contact area between the chips and the antenna than do the contact pads of the chip alone. With the use of strap leads, the alignment between the chip and the antenna does not have to be as precise during the direct placement of the chip on the antenna as without the use of such strap leads. The larger contact area provided by the strap leads reduces the accuracy required for placement of the chips during manufacture while still providing effective electrical connection between the chip and the antenna. However, the accurate placement and mounting of the chips on strap leads and interposers still provide serious obstacles for high-speed manufacturing of RFID tags and labels.

Some challenges that currently face manufacturers or suppliers to component manufacturers include:

1) Wafer Processing: Transfer of chips from a wafer to a suitable substrate.

2) Chip Attachment: Accurately positioning of chips for attachment to strap leads is difficult to achieve at the speeds needed to achieve the economies of scale obtainable through high volume manufacturing.

3) Bonding: It is difficult to accurately bond, cure, and electrically connect the chips to strap leads at rates necessary to achieve high volume manufacturing.

Several possible high-speed strap assembly strategies have been proposed. The first approach, which uses the "pick-and-place" machines typically deployed in the manufacturing of circuit boards for picking up electronic components and placing them on circuit boards, is accurate, but requires expensive machines that ultimately do not deliver a sufficient throughput to justify the increased cost. That is, pick-and-place equipment may only be able to achieve 20-25,000 units per hour (UPH) whereas 100,000 UPH or more is needed for true high speed manufacturing. However, utilizing multiple pick-and-place machines in a line significantly increases the complexity of the manufacturing process and the possibility of error.

Another approach, referred to as a "self-assembly process," is a method in which multiple chips are first dispersed in a liquid slurry, shaken and assembled into a substrate containing chip receiving recesses. Some current processes are described in U.S. Pat. No. 6,848,162, entitled "Method and Apparatus for High Volume Assembly of Radio Frequency Identification Tags," issued to Arneson, et al. on Feb. 1, 2005; U.S. Pat. No. 6,566,744, entitled "Integrated Circuit Packages Assembled Utilizing Fluidic Self-Assembly," issued to Gengel on May 20, 2003; and, U.S. Pat. No. 6,527,964, entitled "Methods and Apparatuses for Improved Flow in Performing Fluidic Self Assembly," issued to Smith et al. on Mar. 4, 2003. Publications, patents and patent applications are referred to throughout this disclosure. All references cited herein are hereby incorporated by reference.

Accordingly, there is a long-felt, but as yet unsatisfied need in the RFID device manufacturing field to be able to produce RFID devices in high volume, and to assemble them at much higher speed per unit cost than is possible using current manufacturing processes.

SUMMARY OF THE PREFERRED EMBODIMENTS

A method for assembling a semiconductor device is provided herein. In one preferred embodiment, the method includes the steps of providing a penetrable substrate having an adhesive surface and a plurality of dies disposed on the adhesive surface; providing a strap lead substrate having a plurality of strap leads disposed thereon; dispensing a first plurality of strap leads from the plurality of strap leads; providing a plurality of pins; bringing the penetrable substrate into close proximity with the strap lead substrate so as to bringing the first plurality of strap leads into contact with the plurality of dies; pressing the first plurality of strap leads against the plurality of dies using the plurality of pins; and, moving the penetrable substrate away from the strap lead substrate while using the plurality of pins to maintain contact between the first plurality of strap leads and the plurality of dies.

A second method for creating a semiconductor device configured in accordance with one preferred embodiment of the present invention is also described herein. The method includes the steps of providing a plurality of strap leads on a strap lead substrate, each strap lead in the plurality of strap leads having a strap lead contact side; providing a plurality of dies on a penetrable die support substrate, each die in the plurality of dies having a die contact side facing the strap lead contact side of a respective strap lead in the plurality of strap leads; moving together the strap lead substrate and the penetrable die support substrate such that the die contact side of each die in the plurality of dies is in contact with the strap lead contact side of the respective strap lead; providing a plurality of pins; pressing the plurality of pins against the plurality of dies; and, separating the strap lead substrate and the penetrable die support substrate while using the plurality of pins to maintain contact between the plurality of dies and the plurality of strap leads.

An apparatus for assembling a semiconductor device is also disclosed. In one preferred embodiment of the present invention, the apparatus includes a pin platform having a plurality of pins with the pin platform having a first surface upon which the plurality of pins are displaced, each pin in the plurality of pins having a tapered end pointing away from the first surface. The apparatus also includes a penetrable die support substrate comprising a first surface and a second surface and a plurality of dies displaced on the first surface; and a strap lead support platform comprising a strap lead substrate with a plurality of strap leads displaced thereon. The strap lead support platform is alignable with the penetrable die support substrate such that the plurality of strap leads on the strap lead substrate are alignable with the plurality of dies on the penetrable die support substrate, with the first surface of the penetrable die support substrate facing the plurality of strap leads, and the first surface of the pin platform facing the second surface of the penetrable die support substrate.

Other features and advantages of the present invention will become apparent to those skilled in the art from the following detailed description. It is to be understood, however, that the detailed description of the various embodiments and specific examples, while indicating preferred and other embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The invention may be more readily understood by referring to the accompanying drawings in which.

Like numerals refer to like parts throughout the several views of the drawings.

DETAILED DESCRIPTION

Figure 1:
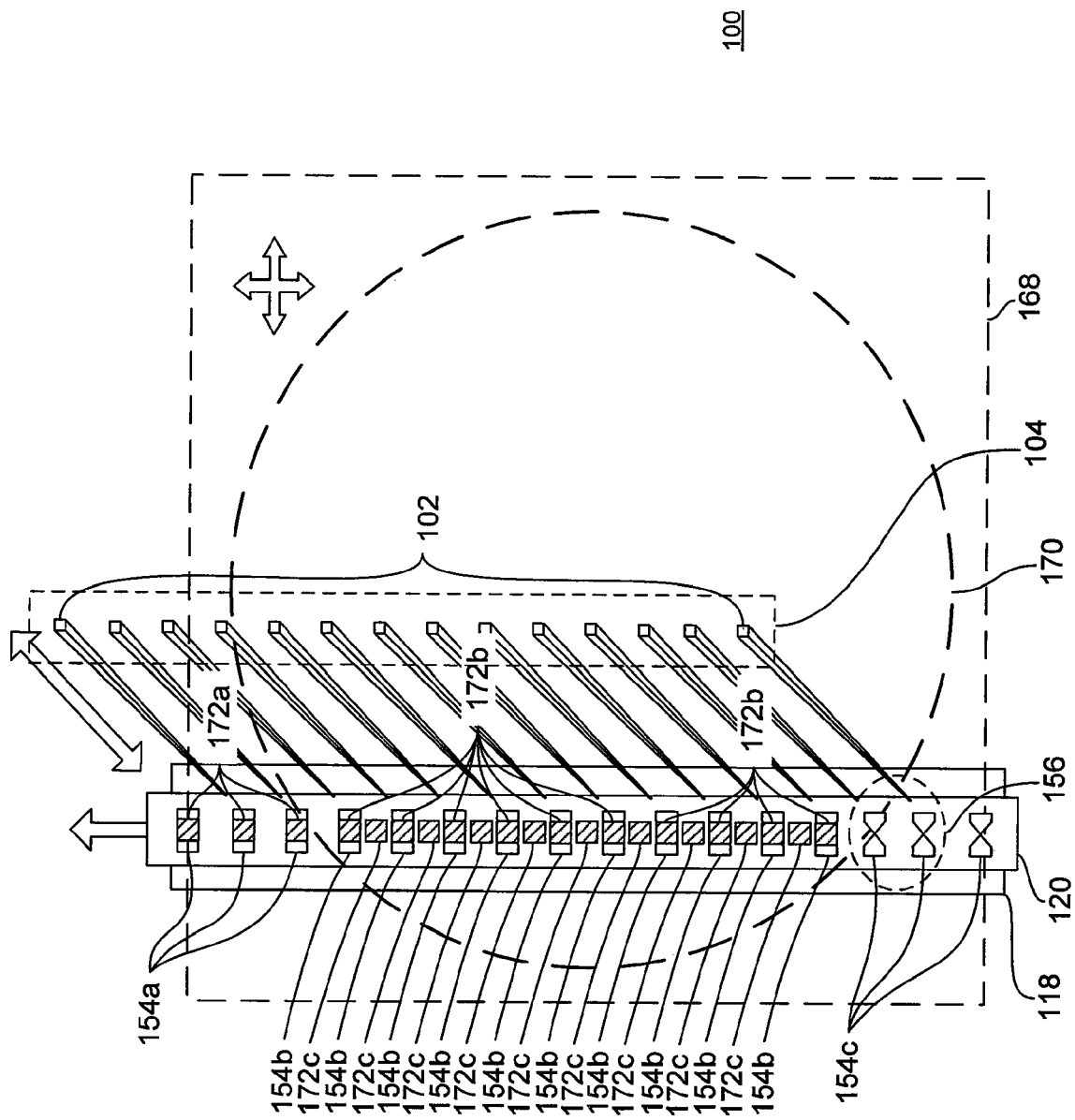
FIG. 1 is a top plan view of a die dispensing apparatus configured in accordance with one preferred embodiment of the present invention.

FIG. 1 illustrates a single column die transfer mechanism 100 configured in accordance to one preferred embodiment of the present invention where the single column die transfer mechanism 100 has three platforms: 1) a pin platform 104, 2) a wafer platform 168, and 3) a strap lead (or antenna lead) platform 118. In one preferred embodiment, the three platforms stack one above another, with the pin platform 104 being the top layer having a plurality of pins 102 pointing in a downwards direction. The wafer platform 168, which is the middle layer, is also referred to as a penetrable carrier and is further described below. It should be noted that the description of the orientation of the various elements in this embodiment as "upwards" or "downwards" is not to be taken as a limitation because other orientations are suitable as well. Similarly, it should be noted that terms such as "top," "topmost," "bottom," and "bottommost" are dependent on the orientation of the particular element being described, and similarly should not be taken as limitations on other possible embodiments.

A wafer 170 is adhered to the bottom of the wafer platform 168 with an adhesive. The wafer 170 is comprised of a plurality of dies 172 (illustrated in the figure as 172a, 172b, and 172c). The strap lead platform 118, which is the bottom-most layer, includes a strap lead substrate 120 having a plurality of strap leads 154 (illustrated in the figure as 154a, 154b, and 154c) disposed thereon. In one preferred embodiment, the strap lead substrate 120 is a web that is unwound from a dispensing roll (not shown) and onto an uptake roll (not shown). The plurality of strap leads 154 on the strap lead platform 118 are facing upwards and ready to receive the plurality of dies 172 from the wafer 170. In one preferred embodiment, the pitch between the strap leads of the plurality of strap leads 154 is a whole number multiple of the pitch between each of the dies in the plurality of dies 172. Thus, for example, the pitch between each of the strap leads of the plurality of strap leads 154 can correspond directly on a one-to-one basis to the pitch between each of the dies in the plurality of dies 172. In another example, the pitch between each of the strap leads of the plurality of strap leads 154 corresponds on a two-to-one basis to the pitch between each of the dies in the plurality of dies 172. In yet another example, the pitch between each of the strap leads of the plurality of strap leads 154 corresponds on an N-to-one basis to the pitch between each of the dies in the plurality of dies 172, where N is a whole integer.

Figure 2:
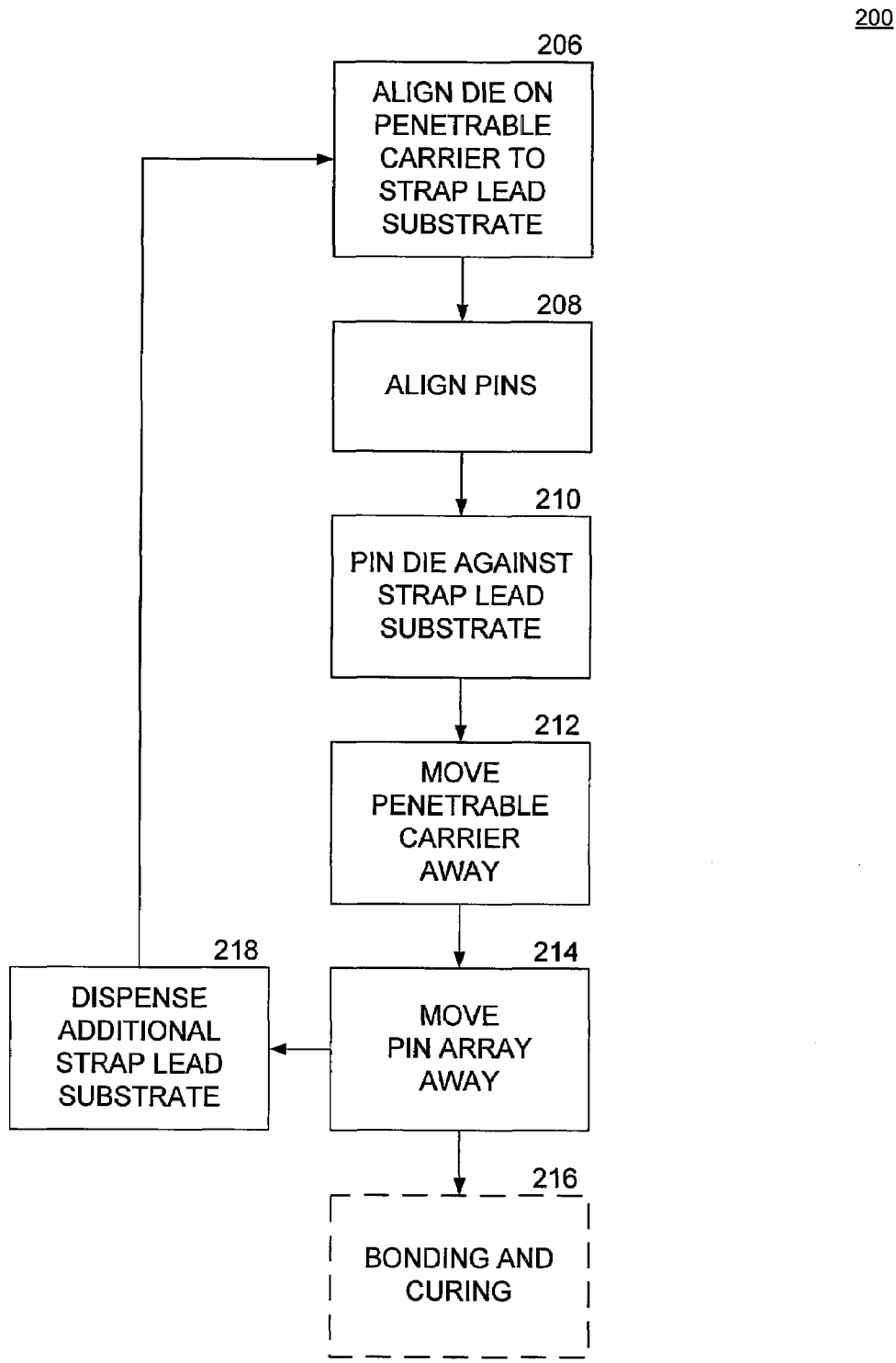
FIG. 2 is a flow diagram of a method for transferring a plurality of dies from a wafer in accordance to a preferred embodiment of the present invention.

FIG. 2 is a high-level overview of one preferred embodiment of a die punch process 200, during which the plurality of dies 172 is transferred from the wafer platform 168 to the strap lead substrate 120 (i.e., the dies on the penetrable carrier are each transferred to a respective strap lead on the strap lead substrate 120) and attached thereto by an adhesive; and a bonding and curing stage 216, during which the dies are simultaneously bonded to the strap lead substrate 120 and the adhesive cured. In one preferred embodiment, the die punch process 200 includes the following stages: a wafer platform and strap lead substrate alignment stage 206, during which the dies on the wafer platform 168 are aligned to the strap lead substrate 120. During the wafer platform and strap lead substrate alignment stage 206, the wafer 170 is positioned so that a subset of the plurality of dies 172 is aligned with a corresponding subset of strap leads on the strap lead substrate 120.

In one preferred embodiment, the plurality of pins 102 on the pin platform 104 are also aligned to the subset of plurality of dies to be transferred from the plurality of dies 172 and the corresponding subset of strap leads on the strap lead substrate 120. The alignment sequence could also include the scenario of aligning the plurality of pins 102 to the subset of plurality of dies to be transferred before the corresponding subset of strap leads on the strap lead substrate 120 are aligned to both the plurality of pins 102 and the subset of plurality of dies to be transferred. Similarly, the plurality of pins 102 may be aligned to the corresponding subset of strap leads on the strap lead substrate 120 before the subset of plurality of dies to be transferred are aligned to both the plurality of pins 102 and the corresponding subset of strap leads on the strap lead substrate 120.

As further described below, die punch process 200 also includes a die pinning stage 210, where the dies are pinned to the strap lead substrate 120 using the plurality of pins 102. In one preferred embodiment, the dies are adhered to the strap leads on the strap lead substrate 120, as further disclosed herein. Then, in a penetrable carrier detachment stage 212, the wafer platform 168 (penetrable carrier) is moved away from the pinned dies, leaving the pinned dies attached to the strap leads. It is noted that the plurality of pins 102 may puncture the penetrable carrier either during the pining down process (i.e., die pinning stage 210) or during the removal of the penetrable carrier (i.e., penetrable carrier detachment stage). A pin array removal stage 214, where the plurality of pins 102 is moved away from the dies that are now attached to the strap lead substrate 120. In one preferred embodiment, once the subset of plurality of dies to be transferred from the plurality of dies 172 is transferred to the corresponding strap leads on strap lead substrate 120, an optional strap lead substrate dispensing stage 218 will be engaged to dispense additional strap leads so process steps 206 to 214 may be repeated, until all the dies of the plurality of dies 172 in wafer 170 are dispensed. Then, a plurality of dies from another wafer may be dispensed using the die punch process 200.

In one preferred embodiment, all three platforms are independently movable in three axes, with a control system controlling the three platforms to precisely dispense the plurality of dies 172 in high speed, as further described herein. In another preferred embodiment, the pin platform 104 will only move up and down, while the wafer platform 168 will not only move up and down but also step horizontally to place a particular subset of dies 172b of the plurality of dies 172 to be under and aligned with the plurality of pins 102 to be punched and transferred to a respective subset of strap leads 154b. The strap lead substrate 120 will be wound up in one direction, and after each winding of the web, fine alignment of the strap lead substrate 120 to the plurality of pins 102 and the wafer 170 may be needed.

In one preferred embodiment, the plurality of pins 102 as well as the plurality of strap leads 154 on the strap lead substrate 120 are configured in a single linear column. The approach can transfer the plurality of dies 172 from the wafer 170, which is in a circular configuration, to a liner continuous web. As noted herein, in one preferred embodiment of the present invention, the pitch between each strap lead in the plurality of strap leads 154 is a whole number multiple of the pitch between each of the dies in plurality of dies 172. Thus, the pitch between each strap lead in the plurality of strap leads 154 can be equal to the pitch between each die in the plurality of dies 172, providing a one-to-one correspondence between the strap leads and the dies.

To ensure that all the dies in the longest die column of the wafer 170 are transferable to the strap lead platform 118, the length of the pin array (i.e., the plurality of pins 172) has to be at least equal or larger than the diameter of the wafer 170 to be processed by the single column die transfer mechanism 100. In other words, the number of pins in the plurality of pins 172 has to be at least as numerous as the number of dies contained in the longest diameter of the wafer 170. In other preferred embodiments, any number of pins in the plurality of pins 172 may be used, except that multiple die transfer operations may be necessary for a single column of the wafer 170 if the length of the pin array is shorter than the diameter of the wafer 170 to be processed. Similarly, the strap lead platform 118 has to be at least as long as the diameter of the wafer 170. However, in the configuration as shown, some of the pins in the plurality of pins 102 as well as a few strap leads 156 of the plurality of strap leads 154 on the strap lead platform 118 are redundant for the purposes of transferring dies from a shorter column of the wafer 170. Although having redundant pins and strap leads will ensure that all the dies of the plurality of dies 172 of the wafer 170 can be transferred, the redundant strap leads 156 will be unused and presumably wasted. Considering that the die is typically the component in an RFID inlay construction having the highest cost, it is preferred that all dies in the plurality of dies 172 are transferred (i.e., it is preferred that no dies are left on the wafer 170 and presumably wasted). However, the presence of the redundant strap leads 156 may cause contamination because the adhesive on the redundant strap leads 156 may smear onto the wafer 170 or the wafer platform 168.

Figure 3:
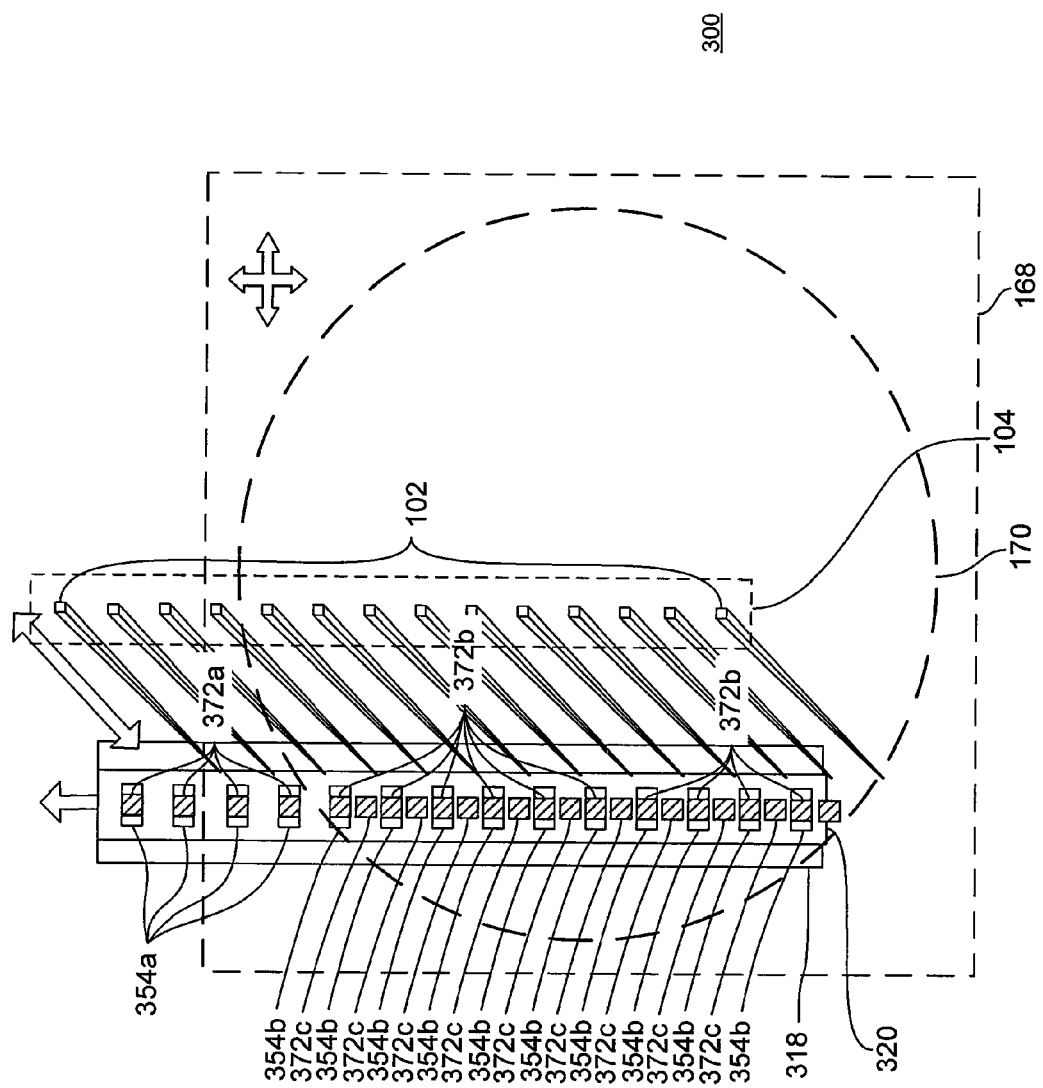
FIG. 3 is a top plan view of a die dispensing apparatus configured in accordance with another preferred embodiment of the present invention.
Figure 4:
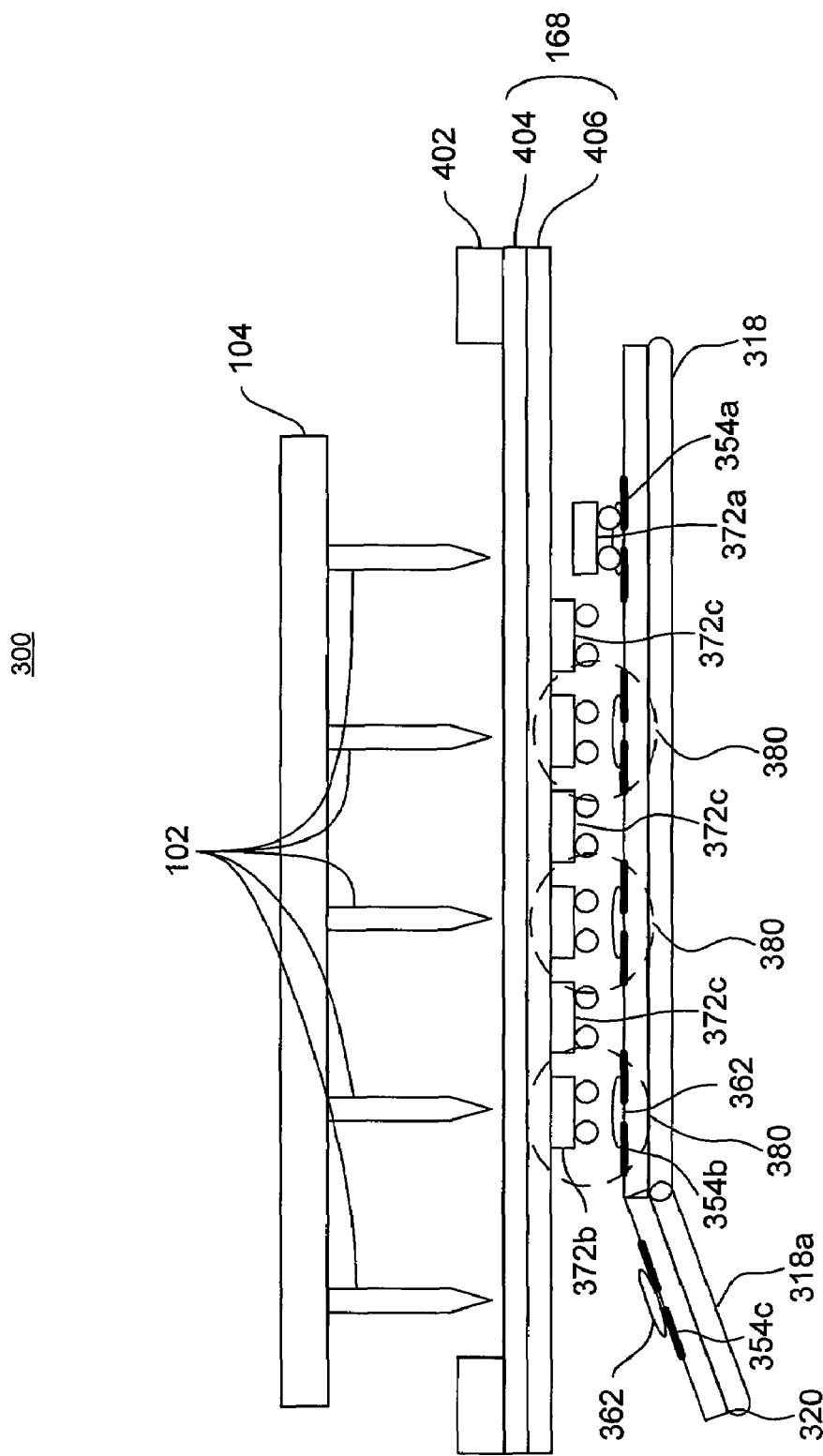
FIG. 4 is a side view of the die dispensing apparatus of FIG. 3.

FIG. 3 illustrates a top plan view and FIG. 4 illustrates a side view of a die transfer mechanism 300 configured in accordance with another preferred embodiment of the present invention. In this embodiment, die transfer mechanism 300 is configured to minimize adhesive smearing during the transfer of dies in a short die column while still using a strap lead platform 318 that is as long as the diameter of the wafer 170. The strap lead platform 318 also includes an angled portion 318a that is angled to reduce the possible contamination of adhesives for dies that are not being placed. The wafer platform 168 includes a penetrable carrier substrate 404 and an adhesive layer 406. The wafer 170 is attached to the adhesive layer 406, with the wafer 170 adhered to the bottom of the penetrable carrier substrate 404. In FIG. 4, it is illustrated that a frame 402 holds the penetrable carrier substrate 404.

Figure 5:
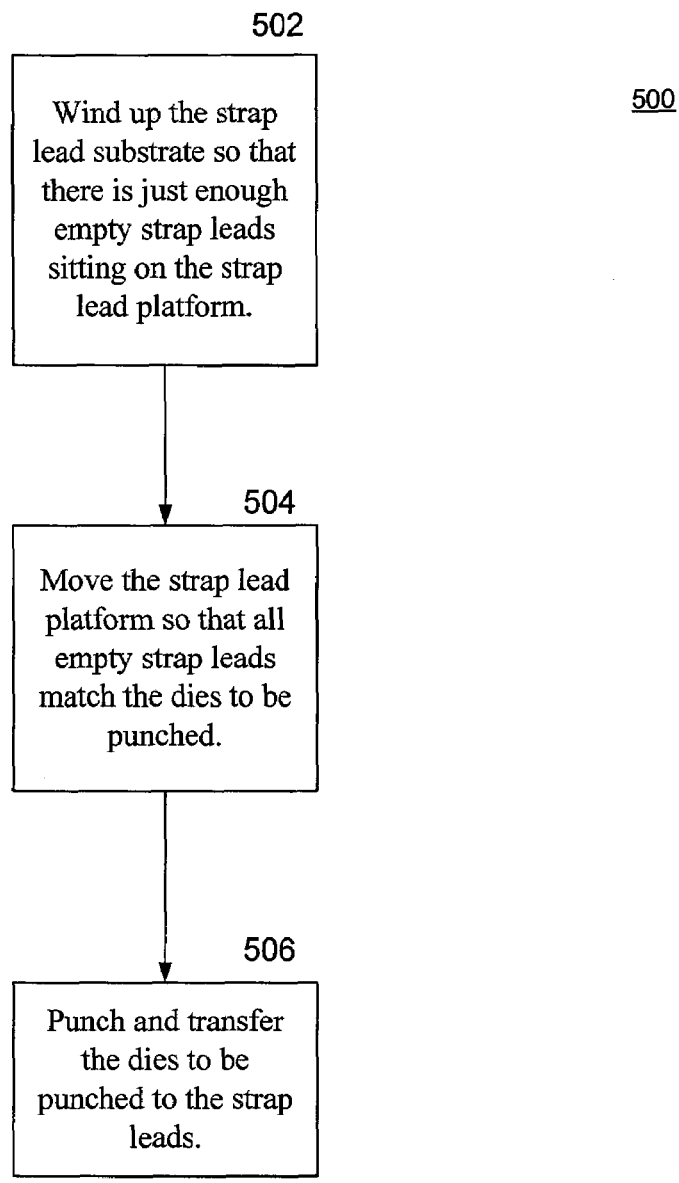
FIG. 5 is a process for dispensing die using the die dispensing apparatus of FIG. 3 pursuant to one preferred embodiment of the present invention.

Referring also to FIG. 5, which will be used to describe the operation of the die transfer mechanism 300, the die transfer mechanism 300 can be used in a process 500 that begins with step 502, where the strap lead substrate 320 is wound so that there are just enough empty strap leads sitting on the strap lead platform 318. In one preferred embodiment of the present invention, having enough empty strap leads means that a number of empty strap leads 354b (i.e., strap leads with no die) is approximately equal to a number of dies to be punched out 372b from the die column in the next punch operation, with the last empty strap lead placed at the end of the strap lead platform 318 from which the strap lead substrate 320 is entering. The strap lead substrate 320 will have straps 372a (i.e., strap leads with dies already dispensed thereon) sitting at the other end of the strap lead platform 318 (i.e., the end of the strap lead platform 318 from which the strap lead substrate 320 exits the strap lead platform 318). In step 504, the strap lead platform 318 is moved so that all the empty strap leads 354b are aligned with both the dies to be punched 372b and the plurality of pins 102 to be used to punch the dies 372b. Then, in step 506, the punch operation is performed to transfer the dies to be punched 372b to the empty straps 354b. As illustrated, die 372b, strap lead 354b and adhesive 362 comprise a device to be assembled 380.

Figure 6:
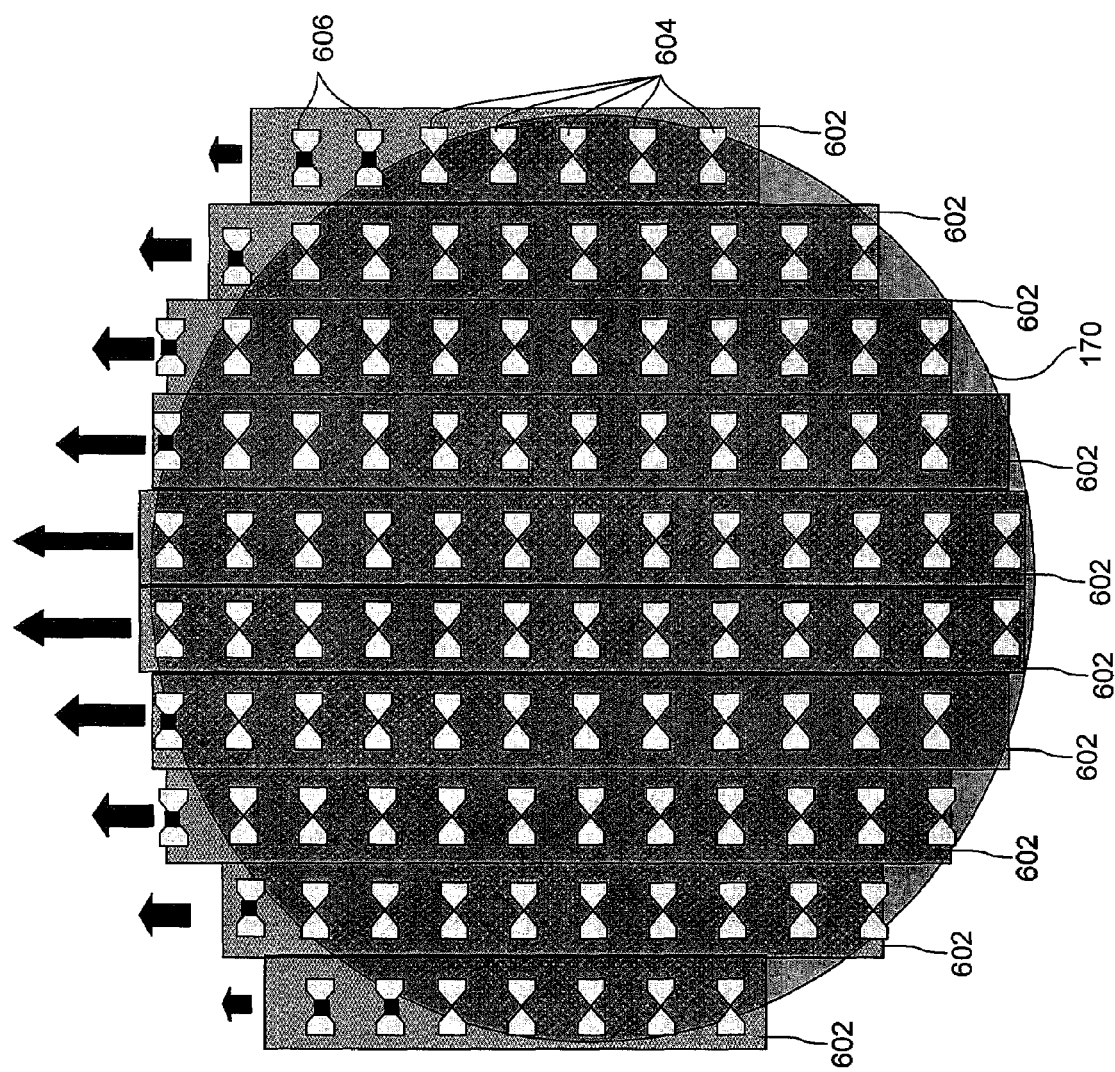
FIG. 6 is a top plan view of a die dispensing apparatus configured in accordance with yet another preferred embodiment of the present invention.

The embodiments referred to above has been described using a single column of pins and strap leads. However, using only a single column of pins and strap leads significantly limit the throughput of the die transfer process. To further improve the throughput of the process, in one preferred embodiment it is desirable to have multiple single-column strap lead substrates and multiple column of pins working concurrently. In one preferred embodiment, as illustrated in FIG. 6, the wafer 170 can be divided into several segments of equal width (e.g., 8 segments for an 8 inch wafer, with each segment being approximately 1 inch wide). Each segment of the wafer 170 will have its own single-column pin array (not shown) with the pin array length approximately equal to the longest column of the total number of dies in each segment. Each segment of the wafer 170 will also have its own single-column strap leads 604 and strap lead platform 602 with the strap lead platform 602 approximately equal to the longest column of the total number of die in each segment. The manner in which each single-column pin array is placed, how each single-column strap lead substrate is wound, how each column of dies are aligned to and attached to each strap lead on each single column strap lead platform 602 follows the procedure described above.

In one preferred embodiment of the present invention, all pins move up and down together, therefore one punch will transfer a set of dies out of each wafer section to their corresponding strap lead platform 602. In this embodiment, it is necessary to synchronize each strap lead platform 602 so that each one follows the three step procedure described in FIG. 5 to receive dies. Thus, it is necessary to: 1) determine how may dies will be transferred out in the next punch while winding up the strap lead substrate with the predicted number of empty strap leads and aligning the last empty strap lead to the edge of the strap lead platform 602; 2) move each strap lead platform 602 so that each of the empty straps are aligned to both the dies to be punched and the pins to be used to punch the dies; and 3) when all the strap lead platforms 602 have finished steps 1 and 2, proceed to punch and transfer the dies.

Portions of the die punch/transfer and attachment process described herein may be optional and the described process may include portions that are not needed for a particular application. Therefore, the description contained herein should be read as illustrating exemplary embodiments of a novel die transfer process as practiced in one preferred embodiment of the present invention and should not be read in a limiting sense. Specifically, the die transfer process described herein is applied to the linear transfer of all dies from a wafer, where dies are being attached to strap leads.

The embodiments described above are exemplary embodiments of the present invention. Those skilled in the art may now make numerous uses of, and departures from, the above-described embodiments without departing from the inventive concepts disclosed herein. Accordingly, the present invention is to be defined solely by the scope of the following claims.

What is claimed is:

1. A method for assembling a semiconductor device comprising:
providing a penetrable substrate having an adhesive surface and a plurality of dies disposed on the adhesive surface;
providing a strap lead substrate having a plurality of strap leads disposed thereon;
dispensing a first plurality of strap leads from the plurality of strap leads;
providing a plurality of pins;
bringing the penetrable substrate into close proximity with the strap lead substrate so as to bringing the first plurality of strap leads into contact with the plurality of dies;
pressing the first plurality of strap leads against the plurality of dies using the plurality of pins; and,
moving the penetrable substrate away from the strap lead substrate while using the plurality of pins to maintain contact between the first plurality of strap leads and the plurality of dies.

2. The method of claim 1, further comprising aligning the plurality of dies and the first plurality of strap leads from the plurality of strap leads.

3. The method of claim 2, wherein the strap lead platform contains an edge, the method further comprising:
aligning a first available strap lead to the edge of the strap lead platform so that the first available strap lead is aligned to a first die in the plurality of dies.

4. The method of claim 1, further comprising aligning the plurality of pins and the plurality of dies.

5. The method of claim 1, further comprising aligning the plurality of pins and the first plurality of strap leads from the plurality of strap leads.

6. The method of claim 1, wherein each strap lead of the plurality of strap leads includes a die-facing surface, and the method further comprising placing an adhesive on the die-facing surface of each of the first plurality of strap leads from the plurality of strap leads before bringing the penetrable substrate into close proximity with the strap lead substrate.

7. The method of claim 6, further comprising curing the adhesive.

8. The method of claim 7, wherein the adhesive is a liquid adhesive and curing the adhesive comprises exposing the adhesive to radiation.

9. The method of claim 7, wherein the adhesive is a liquid adhesive and curing the adhesive comprises exposing the adhesive to heat.

10. The method of claim 6, wherein the adhesive is a solid adhesive and the method further comprises softening the solid adhesive.

11. The method of claim 1, further comprising removing the plurality of pins after moving the penetrable substrate away from the strap lead substrate.

12. The method of claim 1, wherein moving the penetrable substrate away from the strap lead substrate while using the plurality of pins to maintain contact between the first plurality of strap leads and the plurality of dies comprises having the pins penetrate the penetrable substance.

13. The method of claim 1, wherein dispensing the first plurality of strap leads from the plurality of strap leads comprises:
determining how many dies will be transferred; and,
dispensing the strap lead substrate with a sufficient number of empty strap leads for a number of dies to be transferred.

14. The method of claim 1, wherein the plurality of strap leads and the plurality of dies comprises a strap lead pitch between each strap lead of the plurality of strap leads and a die pitch between each of the plurality of dies, respectively, and the strap lead pitch is a whole number multiple of the die pitch.

15. The method of claim 1, wherein the penetrable substrate comprises a second plurality of dies, and the method further comprising:
dispensing a second plurality of strap leads from the plurality of strap leads;
bringing the penetrable substrate into close proximity with the strap lead substrate so as to bringing the second plurality of strap leads into contact with the second plurality of dies;
pressing the second plurality of strap leads against the second plurality of dies using the plurality of pins; and, moving the penetrable substrate away from the strap lead substrate while using the plurality of pins to maintain contact between the second plurality of strap leads and the second plurality of dies.

16. The method of claim 1, wherein the penetrable substrate comprises a multiple plurality of dies, and the method further comprising dispensing additional pluralities of strap leads from the plurality of strap leads on the strap lead substrate to transfer all dies from the multiple plurality of dies.

17. A method for creating a semiconductor device comprising:
providing a plurality of strap leads on a strap lead substrate, each strap lead in the plurality of strap leads having a strap lead contact side;
providing a plurality of dies on a penetrable die support substrate, each die in the plurality of dies having a die contact side facing the strap lead contact side of a respective strap lead in the plurality of strap leads;
moving together the strap lead substrate and the penetrable die support substrate such that the die contact side of each die in the plurality of dies is in contact with the strap lead contact side of the respective strap lead;
providing a plurality of pins;
pressing the plurality of pins against the plurality of dies; and,
separating the strap lead substrate and the penetrable die support substrate while using the plurality of pins to maintain contact between the plurality of dies and the plurality of strap leads.

18. The method of claim 17, further comprising removing the plurality of pins.

19. The method of claim 17, wherein the strap lead substrate is dispensed from a roll.

20. The method of claim 17, the plurality of pins are arranged in a linear fashion.

21. The method of claim 17, the plurality of strap leads are arranged in a linear fashion.

* * * * *